United States Patent [19]

Higuchi

[11] Patent Number: 4,506,164
[45] Date of Patent: Mar. 19, 1985

[54] CMIS LEVEL SHIFT CIRCUIT
[75] Inventor: Mitsuo Higuchi, Tokyo, Japan
[73] Assignee: Fujitsu Limited, Kawasaki, Japan
[21] Appl. No.: 444,482
[22] Filed: Nov. 24, 1982
[30] Foreign Application Priority Data
  Nov. 26, 1981 [JP] Japan .................. 56-189442
[51] Int. Cl.$^3$ .................. H03K 5/02; H03K 17/16;
                                    H03K 3/353; H03K 17/10
[52] U.S. Cl. .................. 307/264; 307/270;
                                  307/279; 307/475; 307/585
[58] Field of Search .................. 307/443, 449, 450, 451,
        307/475, 359, 550, 568, 571, 570, 579, 585, 576,
                                       270, 264, 279, 263

[56] References Cited
U.S. PATENT DOCUMENTS

| | | | |
|---|---|---|---|
| 3,916,430 | 10/1975 | Heuner et al. | 307/270 X |
| 4,080,539 | 3/1978 | Stewart | 307/270 X |
| 4,216,390 | 8/1980 | Stewart | 307/270 X |
| 4,239,994 | 12/1980 | Stewart | 307/359 |
| 4,317,110 | 2/1982 | Hsu | 307/571 X |
| 4,463,273 | 7/1984 | Dingwall | 307/579 X |

Primary Examiner—Stanley D. Miller
Assistant Examiner—David R. Bertelson
Attorney, Agent, or Firm—Staas & Halsey

[57] ABSTRACT

A semiconductor device includes a first circuit (C1, C1') driven by a first power supply ($V_{cc}$) and a second circuit (C2) driven by a second power supply ($V_{pp}$) which has a higher potential than the first power supply. A P-channel transistor ($Q_{18}$) is provided on the input side of the second circuit and is controlled by the feedback of an output of the second circuit. The P-channel transistor has a source connected to the second power supply. In addition, two N-channel transistors ($Q_{19}$, $Q_{20}$) are connected in series between the output of the first circuit and the input of the second circuit. Each of the N-channel transistors has a gate, connected to the first power supply and the second power supply, respectively.

7 Claims, 10 Drawing Figures

CMIS LEVEL SHIFT CIRCUIT

BACKGROUND OF THE INVENTION (1) Field of the Invention

The present invention relates to a semiconductor device in which two circuits are driven by two power supplies having different potentials.

For example, the present invention can be applied to a level shifting circuit using complementary metal-insulator semiconductor (CMIS) circuits in an erasable programmable read-only memory (EPROM).

(2) Description of the Prior Art

For example, in an EPROM, in order to reduce power dissipation, peripheral circuits such as address buffers, address decoders, level shifting circuits, and the like are constructed with complementary metal-oxide semiconductor (CMOS), broadly, CMIS, circuits. In such an EPROM, the read operation is performed using a low voltage of, for example, 5 volts, while the write operation is performed using a high voltage of, for example, 20 volts, to inject carriers into the floating gate thereof.

Assume that different voltages in response to the read operation and the write operation are applied to the same power supply terminal. In this case, since a high voltage is applied to the entire device during the write operation, all the circuit elements used in the device are required to withstand this high voltage, which is not preferable in view of integration density, reliability characteristics, and the like.

In a prior art device, during the write operation, only the circuit elements requiring a high voltage are driven by the high voltage, the other circuit elements being driven by a low voltage.

The above-mentioned prior art device, however, has a problem in that the sequence of supplying power is restricted. This restriction will be explained in detail later.

SUMMARY OF THE INVENTION

It is an object of the present invention to provide a semiconductor device having two circuits driven by two different power supplies in which the sequence of supplying power is not restricted.

According to the present invention, two N-channel transistors are connected in series between the output of a first circuit driven by a low voltage and the input of a second circuit driven by a high voltage. In addition, a P-channel transistor is provided on the input side of the second circuit to adjust the input level of the second circuit with the feedback of an output thereof. Each of the two N-channel transistors has a gate, connected to the low voltage source and the high voltage source, respectively. Therefore, only when both a low voltage and a high voltage are supplied, the output of the first circuit is transmitted through the two N-channel transistors to the input of the second circuit. As a result, the sequence of turning on the two N-channel transistors, i.e., the sequence of supplying power, is not restricted.

The present invention will be more clearly understood from the description as set forth below, which contrasts the present invention with the prior reference to the accompanying drawings.

DESCRIPTION OF THE PREFERRED EMBODIMENTS

Figure 1:
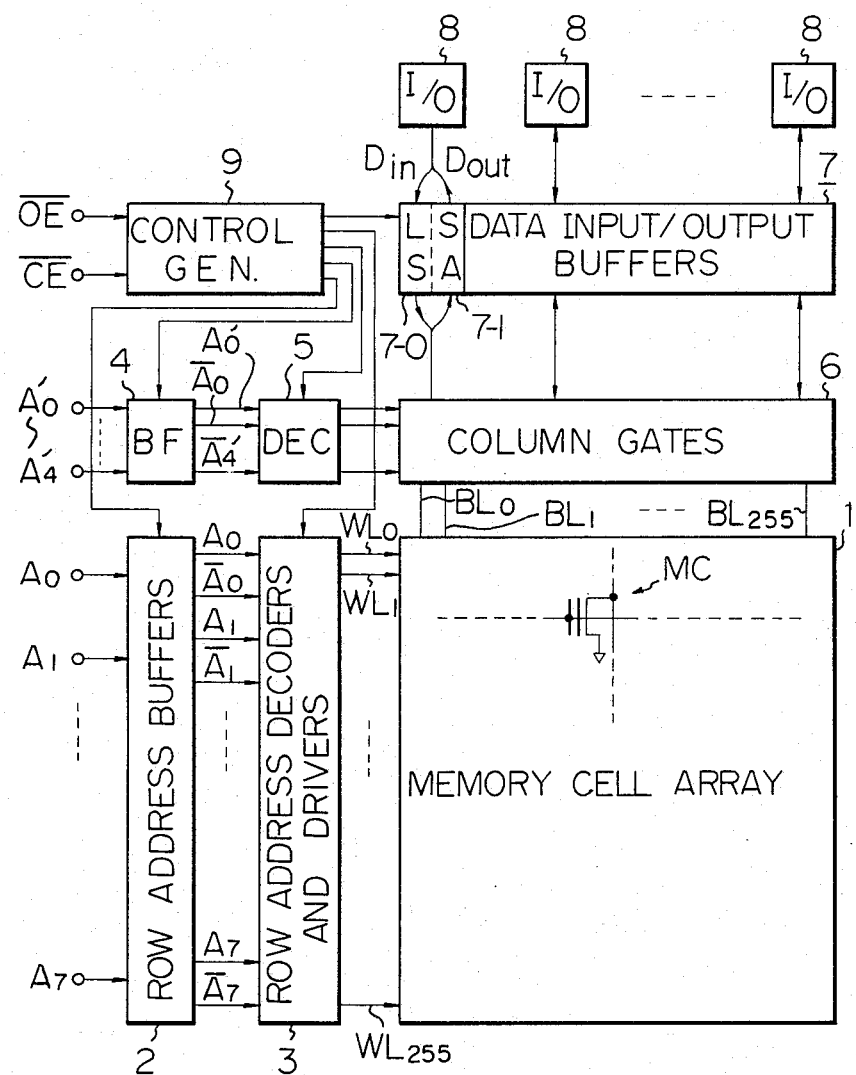
FIG. 1 is a block diagram of a general EPROM.

In FIG. 1, reference numeral 1 designates a memory cell array in which a plurality of memory cells, for example, 65,536 ($=2^{16}$) memory cells MC of a charge storage type, such as floating-gate avalanche MOS's (FAMOS's), are arranged. Each of the memory cells is connected to one of the word lines $WL_0$, $WL_1$, ..., $WL_{255}$ and to one of the bit lines $BL_0$, $BL_1$, ... $BL_{255}$.

Row address buffers 2 convert a transistor-transistor logic (TTL) level of row address signals $A_0$, $A_1$, ..., $A_7$ into a MOS level of row address signals $A_0$, $A_1$, ..., $A_7$ and into their inverted signals $\overline{A}_0$, $\overline{A}_1$, ..., $\overline{A}_7$, which are decoded by row address decoders and drivers 3. As a result, the row address decoders and drivers 3 select one of the word lines $WL_0$, $WL_1$, ..., $WL_{255}$. Similarly, column address buffers 4 convert a TTL level of column address signals $A_0'$, $A_1'$, ..., $A_4'$ into a MOS level of column address signals $A_0'$, ..., $A_4'$ and into their inverted signals $\overline{A}_0'$, $\overline{A}_1'$, ... $\overline{A}_4'$, which are decoded by column decoders 5, which drive column gates 6.

Reference numeral 7 designates eight data input/output buffers. In more detail, each of the input buffers includes a level shifting circuit 7-0 for changing the potential level of an input data signal $D_{in}$ of one of the input/output terminals 8 from a TTL level to a MOS level while each of the output buffers includes a sense amplifier circuit 7-1 for sensing the stored information in a memory cell so as to output output data $D_{out}$ to one of the input/output terminals 8.

Reference numeral 9 designates a control signal generating circuit which receives external control signals $\overline{OE}$ and $\overline{CE}$ and generates various internal control signals to the elements 2, 3, 4, 5 and 7 and the like.

The above-mentioned level shifting circuit 7-0 will be explained with reference to an example in which two circuits which are driven by two different power supplies are used.

Figure 2:
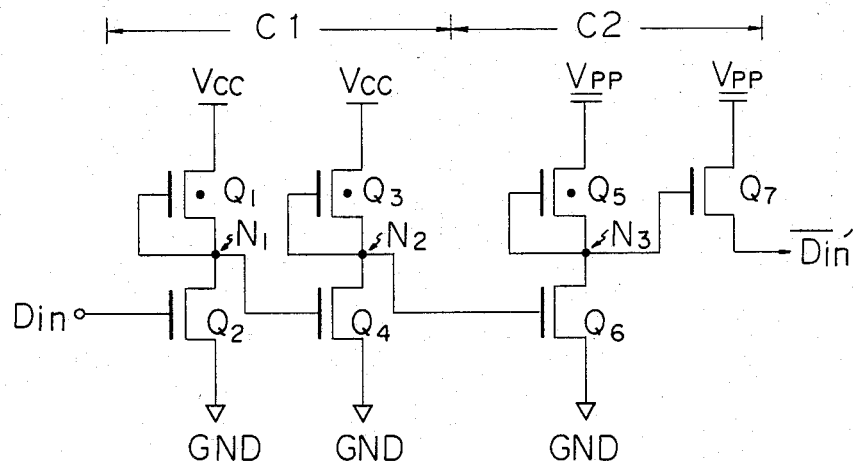
FIG. 2 is a circuit diagram of a first prior art level shifting circuit.

In FIG. 2, which is a first prior art level shifting circuit, enhancement/depletion (E/D)-type MOS transistors are used. That is, a first circuit C1 formed by transistors $Q_1$ through $Q_4$ is driven by a low power supply $V_{cc}$ of, for example, about 5 volts, while a second circuit C2 formed by transistors $Q_5$ through $Q_8$ is driven by a high power supply $V_{pp}$ of, for example, about 20 volts.

When the potential of the data signal $D_{in}$ is low (GND), the potential at the node $N_1$ is high ($V_{cc}$), and, accordingly, the potential at the node $N_2$ is low (GND). As a result, the potential at the node $N_3$ is high ($V_{pp}$), and, accordingly, the potential of the output $\overline{D_{in}}'$ is high ($V_{pp}-V_{th}$), where $V_{th}$ is the threshold voltage of the transistor $Q_7$. However when the potential of the data signal $D_{in}$ is high, the potential at the node $N_1$ is low (GND), and, accordingly, the potential at the node $N_2$ is high ($V_{cc}$). As a result, the potential at the node $N_3$ is low (GND), and, accordingly, the potential of the output $\overline{D_{in}}'$ is in a floating state or low (GND). Thus, the voltage amplitude of the data signal $D_{in}$, which is, for example, a TTL level, is converted into a large voltage amplitude (about 20 volts).

Figure 3:
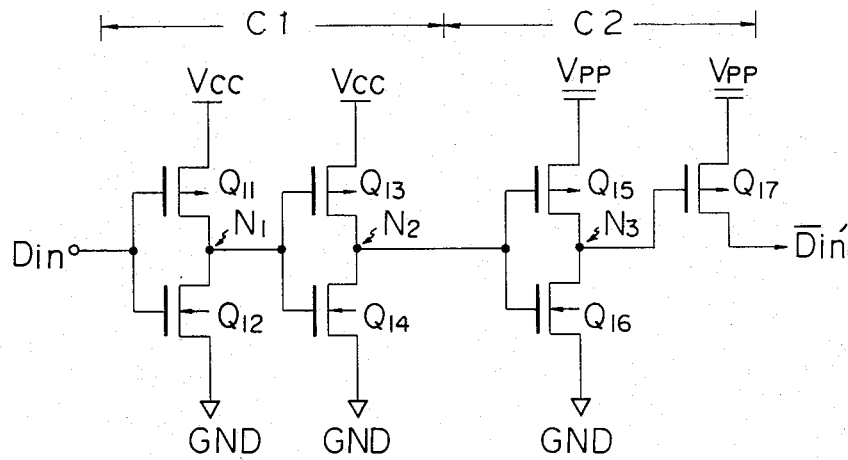
FIG. 3 is a circuit diagram of a second prior art level shifting circuit.

Generally, CMOS circuits are advantageous over E/D-type MOS circuits in regard to power dissipation. In FIG. 3, the depletion-type transistors $Q_1$, $Q_3$ and $Q_5$ of FIG. 2 are replaced with P-channel transistors $Q_{11}$, $Q_{12}$ and $Q_{13}$, respectively, and the enhancement-type transistors $Q_2$, $Q_4$, $Q_6$ and $Q_7$ of FIG. 2 are replaced with N-channel transistors $Q_{12}$, $Q_{14}$, $Q_{16}$ and $Q_{17}$, respectively. Thus, the circuit of FIG. 3 is constructed with CMOS circuits.

In FIG. 3 when the data signals $D_{in}$ is high, the potential at the node $N_2$ is also high ($V_{cc}$). In this case, however, the transistor $Q_{15}$ is not completely cut off since the source voltage $V_{pp}$ is very high as compared with the gate voltage $V_{cc}$. As a result, a current flows through the path: $V_{pp}$-$Q_{15}$-$N_3$-$Q_{16}$-GND, and, accordingly, the potential of the output $\overline{D_{in}}'$ increases. This phenomenon is not preferable with respect to low power dissipation. In addition, the level shifting operation is not completely performed.

Figure 4:
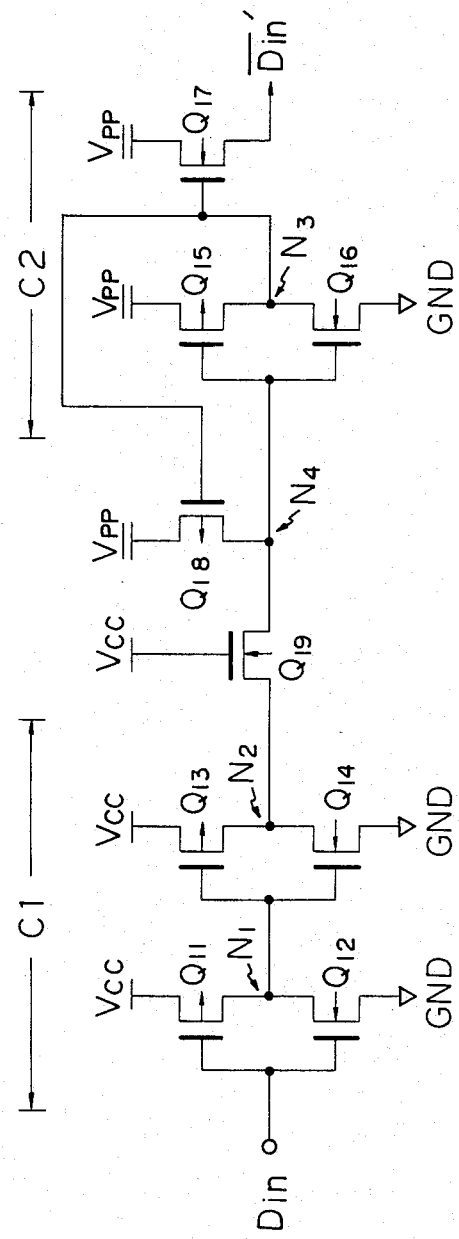
FIG. 4 is a circuit diagram of a third prior art level shifting circuit.

A level shifting circuit as illustrated in FIG. 4, which avoids the above-mentioned phenomenon, is known. In FIG. 4, a P-channel transistor $Q_{18}$ and an N-channel transistor $Q_{19}$ are added between the first circuit C1 and the second circuit C2. The transistor $Q_{18}$ has a source connected to the power supply $V_{pp}$, a gate connected to the node $N_3$, that is, to the output of the CMOS circuit formed by the transistors $Q_{15}$ and $Q_{16}$, and a drain connected to the node $N_4$, that is, to the input of the CMOS circuit formed by the transistors $Q_{15}$ and $Q_{16}$. The transistor $Q_{19}$ has a drain connected to the node $N_2$, a gate connected to the power supply $V_{cc}$, and a source connected to the node $N_4$.

The operation of the circuit of FIG. 4 will now be explained. When the data signal $D_{in}$ is high, the potential at the node $N_1$ is low (GND), and, accordingly, the potential at the node $N_2$ is high ($V_{cc}$). As a result, the potential at the node $N_4$ is also high ($V_{cc}-V_{th}$), where $V_{th}$ is the threshold voltage of the transistor $Q_{19}$. Therefore, the transistor $Q_{16}$ is turned on so that the potential at the node $N_3$ becomes low (GND). Due to the feedback of the potential at the node $N_3$ to the gate of the P-channel transistor $Q_{18}$, the transistor $Q_{18}$ is turned on to increase the potential at the node $N_4$. Therefore, the transistor $Q_{15}$ is completely cut off, and, accordingly, the above-mentioned current in FIG. 3 does not flow.

The transistor $Q_{19}$ prevents a high voltage $V_{pp}$ from being applied to the first circuit C1. In addition, as explained above, when the potential at the node $N_2$ becomes high ($V_{cc}$), the potential at the node $N_4$ increases, so that the transistor $Q_{19}$ is cut off to shut off the current flowing therethrough.

Thus, the circuit of FIG. 4 operates stably if normal voltages are applied to the two power supply terminals, that is, if the voltage $V_{pp}$ is higher than the voltage $V_{cc}$. In the circuit of FIG. 4, however, there is a problem in that the sequence of supplying power is restricted, which will now be explained.

Figure 5:
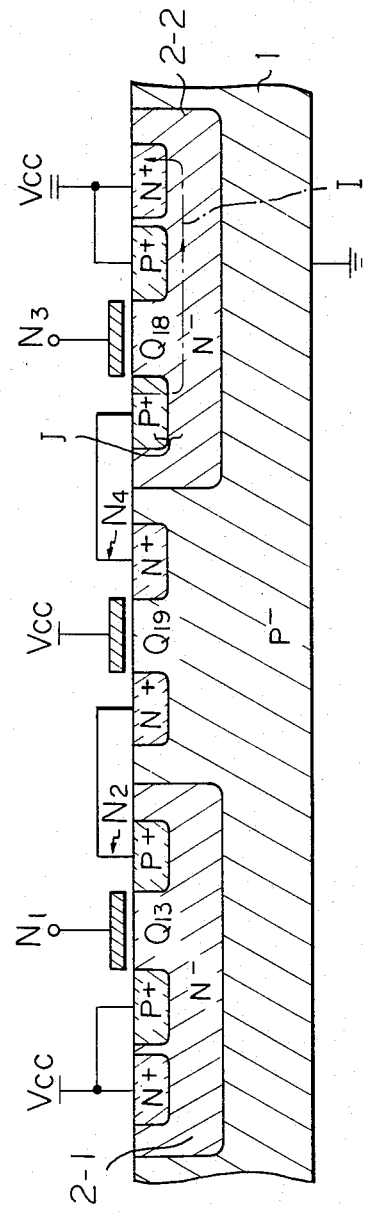
FIG. 5 is a partial cross-sectional view of the level shifting circuit of FIG. 4.

In FIG. 5, which is a cross-sectional view of the transistors $Q_{13}$, $Q_{18}$ and $Q_{19}$ of FIG. 4, a P-type semiconductor substrate 1 in which a plurality of N-type well regions 2-1 and 2-2 are formed, is used. In this case, N-channel transistors are formed in the P-type semiconductor substrate 1 while P-channel transistors are formed in the N-type well regions. Note that a GND potential is applied and that the power supply voltages $V_{cc}$ and $V_{pp}$ are applied to the well regions 2-1 and 2-2, respectively.

Now, assume that only the voltage $V_{cc}$ becomes 5 volts while the voltage $V_{pp}$ remains at GND potential. In this state, when the potential of the data signal $D_{in}$ (FIG. 4) is high, the potential at the node $N_2$ is high ($V_{cc}$) and the potential at the node $N_4$ is also high ($V_{cc}-V_{th}$). Therefore, a current flows through the path: $V_{cc}$-$Q_{13}$-$N_2$-$Q_{19}$-$N_4$ so that the potential at the node $N_4$ increases. In this state, since the voltage $V_{pp}$ remains at GND potential, the potential of the well region 2-2 is also at GND potential. Therefore, a PN junction J is forward-biased so that an undesired current I flows therethrough. This current I flows into the terminal of the power supply $V_{pp}$ on the system side, which used an EPROM, so that the system may be reset. Thus, in the circuit of FIG. 4, it is necessary to restrict the sequence of supplying power. That is, the increase of the voltage $V_{cc}$ must not precede the increase of the voltage $V_{pp}$. This restriction is not preferable for an EPROM.

Figure 6:
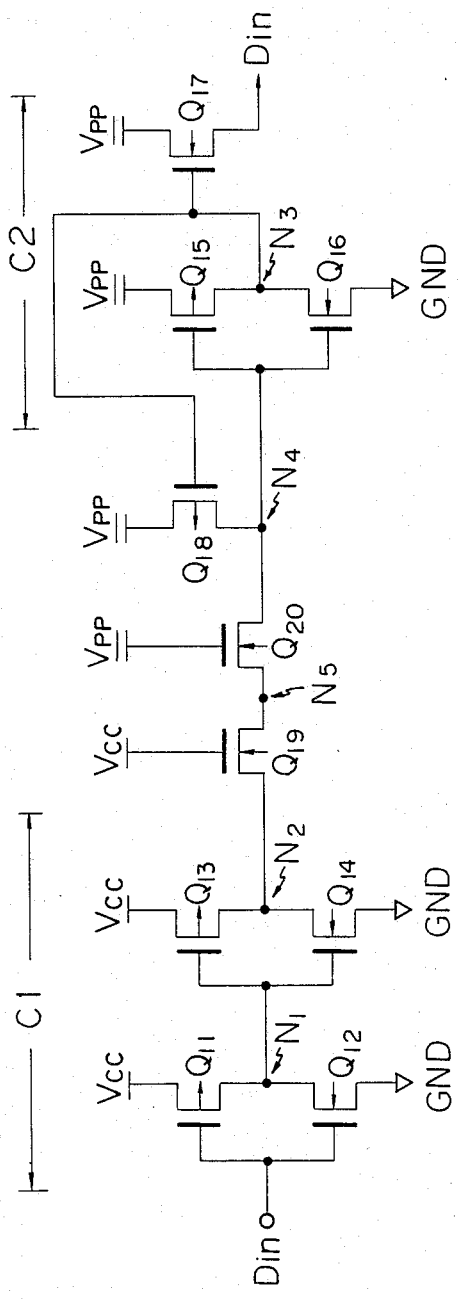
FIG. 6 is a circuit diagram of a first embodiment of the semiconductor device of the present invention.

FIG. 6 is a circuit diagram of a first embodiment of the semiconductor device according to the present invention. In FIG. 6, an N-channel transistor $Q_{20}$ is added to FIG. 5. The transistor $Q_{20}$, which is connected in series with the transistor $Q_{19}$, has a drain connected to the source of the transistor $Q_{19}$, a source connected to the node $N_4$, and a gate connected to the power supply $V_{pp}$.

If the voltage $V_{cc}$ becomes 5 volts, and the voltage $V_{pp}$ remains at GND potential, the gate of the transistor $Q_{20}$ remains at GND potential, even when the data signal $D_{in}$ is high, so as to increase the potential at the node $N_5$. Therefore, the transistor $Q_{20}$ is cut off, and, as a result, the potential at the node $N_4$ does not increase.

Figure 7:
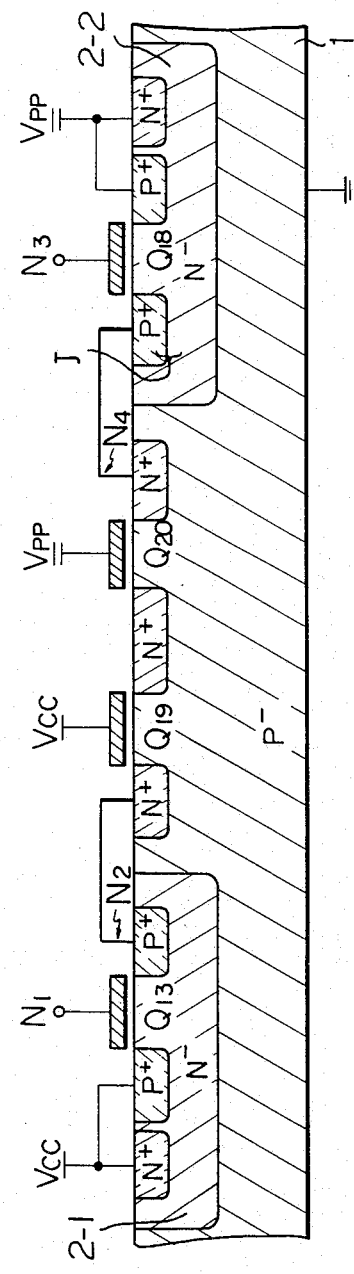
FIG. 7 is a partial cross-sectional view of the device of FIG. 6.

On the other hand, if the voltage $V_{cc}$ becomes 5 volts and, in addition, the voltage is lower than the voltage $V_{pp}$, the potential at the node $N_4$ increases to a value $V_{pp}-V_{th}$ where $V_{th}$ is the threshold voltage of the transistor $Q_{20}$. Therefore, the PN junction J, which is illustrated in FIG. 7, is never forward-biased. Thus, it is not necessary to restrict the sequence of supplying power.

Figure 8:
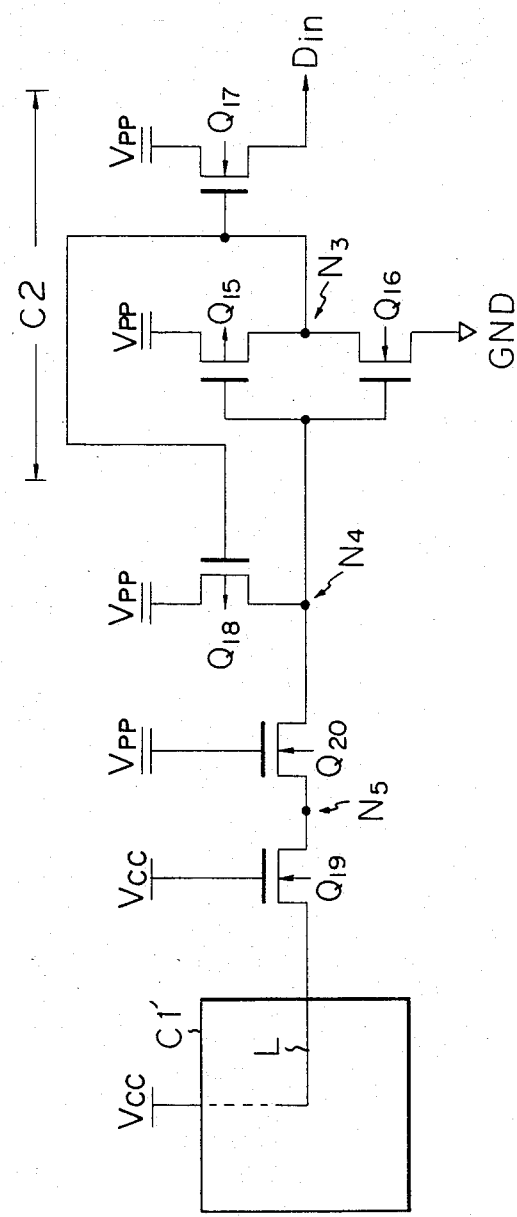
FIG. 8 is a circuit diagram of a second embodiment of the semiconductor device of the present invention.
Figure 9:
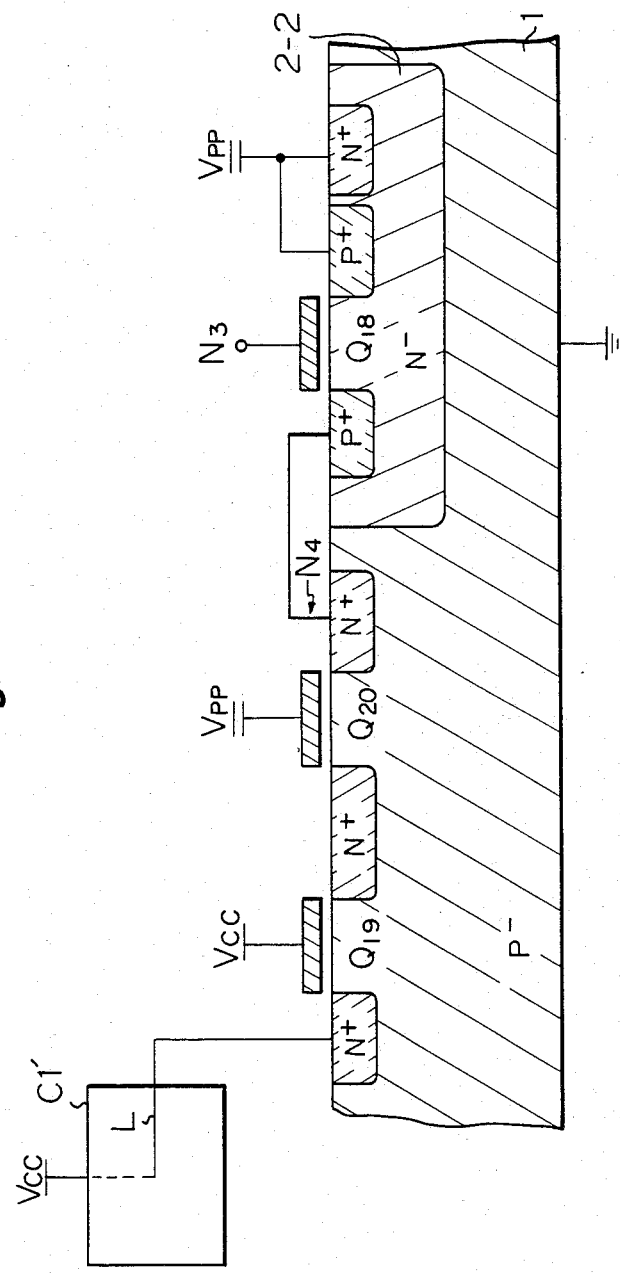
FIG. 9 is a partial cross-sectional view of the device of FIG. 8.

FIG. 8 is a circuit diagram of a second embodiment of the semiconductor device according to the present invention, and FIG. 9 is a partial cross-sectional view of the device of FIG. 8. In FIG. 8, a circuit C1' is provided instead of the first circuit C1 of FIG. 7. The circuit C1' is driven by the power supply $V_{cc}$ and generates an output having about the same potential as the voltage $V_{cc}$. Note that the circuit C1' is not provided in the semiconductor substrate, which is, in this case, a P-type semiconductor substrate, while the other elements $Q_{15}$ through $Q_{20}$ are provided in the semiconductor substrate. For example, the circuit C1' comprises a connection L connected between the power supply $V_{cc}$ and the source of the transistor $Q_{19}$.

In the embodiment illustrated in FIGS. 8 and 9, no restriction of the sequence of supplying power supply voltages $V_{cc}$ and $V_{pp}$ is required.

In the above-mentioned embodiments, a device formed on a P-type semiconductor substrate is illustrated. The present invention can also be applied to a device formed on an N-type semiconductor substrate. However, it should be noted that the circuit of FIG. 6 cannot be constructed by using an N-type semiconductor substrate since, in this case, the substrate must be connected to the power supply $V_{pp}$, and in addition, P+-type regions and P-type wells within the substrate cannot both be connected to the power supply $V_{cc}$ (which may forward-bias the PN junctions).

Figure 10:
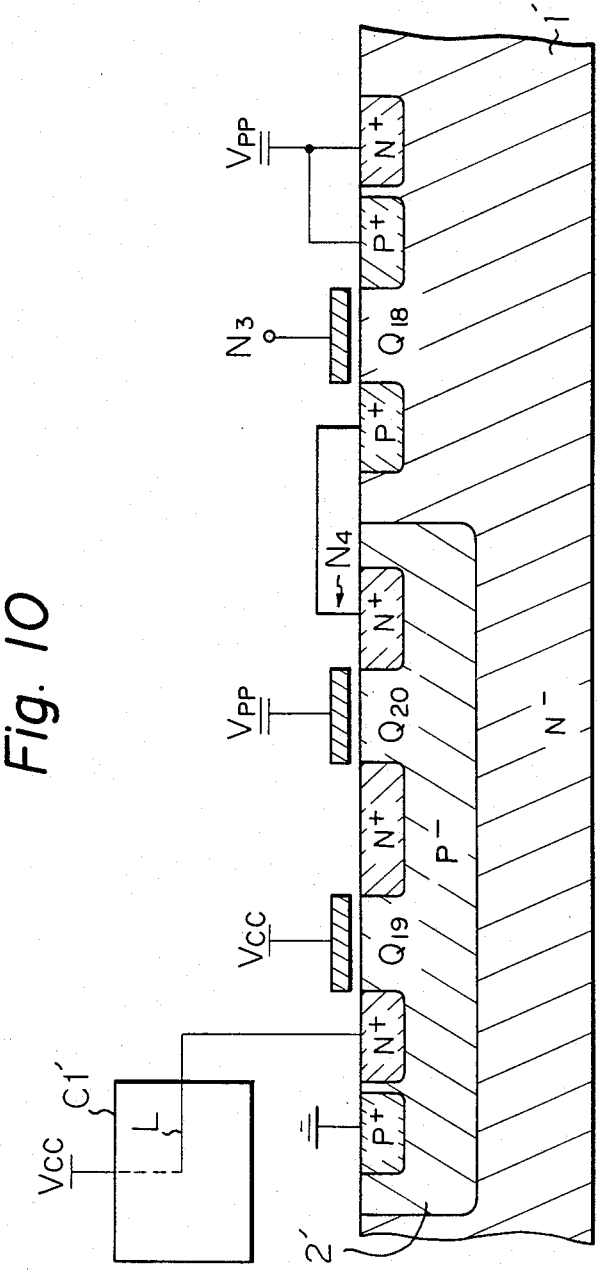
FIG. 10 is a cross-sectional view of a third embodiment of the semiconductor device of the present invention.

The circuit of FIG. 8 is constructed by using an N-type semiconductor substrate as illustrated in FIG. 10. In FIG. 10, reference numeral 1' designates an N-type semiconductor substrate connected to the power supply $V_{pp}$, and 2' designates a P-type well regions connected to GND potential. In this case, P-channel transistors are formed in the substrate 1' while N-channel transistors are formed in the well regions, such as 2'.

As explained above, in the present invention, the sequence of supplying power is not restricted.

I claim:

1. A semiconductor device comprising:
    first and second power supplies, said second power supply having a higher potential than said first power supply;
    a first circuit, operatively connected to and driven by said first power supply, for generating an output which is substantially the same potential as that of said first power supply;
    a second circuit, operatively connected to and driven by said second power supply, comprising at least one CMIS circuit having an input terminal and an output terminal;
    a P-channel transistor having a source operatively connected to said second power supply, a drain operatively connected to said input terminal of said at least one CMIS circuit of said second circuit, and a gate operatively connected to said output terminal of said at least one CMIS circuit of said second circuit; and
    first and second N-channel transistors operatively connected in series between said first circuit and said input terminal of said at least one CMIS circuit of said second circuit, said first N-channel transistor having a gate operatively connected to said first power supply and said second N-channel transistor having a gate operatively connected to said second power supply.

2. A device as set forth in claim 1, further comprising:
    a P-type semiconductor substrate in which said first and second N-channel transistors are formed; and
    a plurality of N-type well regions formed in said semiconductor substrate, said P-channel transistor being formed in each of said plurality of N-type well regions.

3. A device as set forth in claim 2, wherein said first circuit comprises two CMIS circuits operatively connected to and driven by said first power supply.

4. A device as set forth in claim 1, further comprising:
    an N-type semiconductor substrate in which said P-channel transistor is formed; and
    at least one P-type well region formed in said N-type semiconductor substrate, in which said first and second N-channel transistors are formed.

5. A device as set forth in claim 1, wherein said first circuit comprises a connection terminal operatively connected to said first power supply and said series connection of said first and second N-channel transistors.

6. A device as set forth in claim 1, wherein said second circuit comprises an N-channel transistor having a source operatively connected to said second power supply, a gate operatively connected to said output terminal of said CMIS circuit of said second circuit, and a drain which serves as an output of said second circuit.

7. A semiconductor device operatively connectable to first and second power supplies, the second power supply having a potential higher than the first power supply, the semiconductor device comprising:
    a first circuit, operatively connected to and driven by the first power supply, for generating an output having substantially the same potential as that of the first power supply;
    a second circuit, operatively connected to and driven by the second power supply, comprising a CMIS circuit having an input terminal and an output terminal;
    a P-channel transistor having a source operatively connected to the second power supply, a drain operatively connected to said input terminal of said CMIS circuit, and a gate operatively connected to said output terminal of said CMIS circuit; and
    first and second N-channel transistors, operatively connected in series between said first circuit and said input terminal of said CMIS circuit of said second circuit, said first and second N-channel transistors having gates operatively connected to the first and second power supplies, respectively.

* * * * *

UNITED STATES PATENT AND TRADEMARK OFFICE
CERTIFICATE OF CORRECTION

PATENT NO. : 4,506,164
DATED : MARCH 19, 1985
INVENTOR(S) : MITSUO HIGUCHI

It is certified that error appears in the above-identified patent and that said Letters Patent is hereby corrected as shown below:

```
Col. 1, line 64, "prior" should be --prior art--;
        line 64, "reference" should be --with reference--.

Col. 2, line 30, "..." should be --...,--;
        line 41, "..." should be --...,--;
        line 56, delete "and the like";
        line 66, "V_CC of" should be --V_CC of--.

Col. 3, line 7, "However" should be --However,--.

Col. 5, line 20, "regions" should be --region--.
```

Signed and Sealed this

Tenth Day of September 1985

[SEAL]

Attest:

DONALD J. QUIGG

Attesting Officer     Acting Commissioner of Patents and Trademarks - Designate